(12) United States Patent
Ok et al.

(10) Patent No.: US 9,887,289 B2
(45) Date of Patent: Feb. 6, 2018

(54) METHOD AND STRUCTURE OF IMPROVING CONTACT RESISTANCE FOR PASSIVE AND LONG CHANNEL DEVICES

(71) Applicant: International Business Machines Corporation, Armonk, NY (US)

(72) Inventors: Injo Ok, Loudonville, NY (US); Soon-Cheon Seo, Glenmont, NY (US); Balasubramanian Pranatharthiharan, Watervliet, NY (US); Charan V. V. S. Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/968,063

(22) Filed: Dec. 14, 2015

(65) Prior Publication Data

US 2017/0170315 A1 Jun. 15, 2017

(51) Int. Cl.
| | | |
|---|---|---|
| *H01L 29/76* | (2006.01) | |
| *H01L 29/78* | (2006.01) | |
| *H01L 29/417* | (2006.01) | |
| *H01L 21/28* | (2006.01) | |
| *H01L 29/66* | (2006.01) | |

(52) U.S. Cl.
CPC .... *H01L 29/7845* (2013.01); *H01L 21/28097* (2013.01); *H01L 29/41725* (2013.01); *H01L 29/6653* (2013.01); *H01L 29/66545* (2013.01)

(58) Field of Classification Search
CPC ........... H01L 29/7845; H01L 21/28097; H01L 29/41725; H01L 29/6653; H01L 29/66545
See application file for complete search history.

(56) References Cited

U.S. PATENT DOCUMENTS

| | | | |
|---|---|---|---|
| 6,593,217 B1 * | 7/2003 | Fujisawa | H01L 21/28518 257/E21.165 |
| 7,649,232 B2 * | 1/2010 | Tamura | H01L 21/743 257/288 |
| 8,358,012 B2 * | 1/2013 | Haran | H01L 21/28518 257/382 |
| 8,415,250 B2 * | 4/2013 | Alptekin | H01L 29/7833 257/410 |
| 8,415,259 B2 | 4/2013 | Lee et al. | |
| 2007/0004123 A1 | 1/2007 | Bohr et al. | |

(Continued)

OTHER PUBLICATIONS

Ip.com; "A Structure for Forming a Contact with Improved Contact Resistance and Overlay Tolerance"; ip.com No. 00226568; p. 1-5; Apr. 16, 2013.

*Primary Examiner* — Mark Tornow
(74) *Attorney, Agent, or Firm* — Cantor Colburn LLP; Steven Meyers

(57) ABSTRACT

A semiconductor device includes a gate arranged on a substrate; a source/drain formed on the substrate adjacent to the gate; a source/drain contact extending from the source/drain and through an interlayer dielectric (ILD) over the source/drain, a portion of the source/drain positioned adjacent to the source/drain contact; and a silicide positioned along a sidewall of the source/drain contact between the portion of the source/drain and the source/drain contact, and along an endwall of the source/drain contact between the source/drain contact and the substrate.

9 Claims, 17 Drawing Sheets

(56) References Cited

U.S. PATENT DOCUMENTS

| | | | |
|---|---|---|---|
| 2011/0210395 A1* | 9/2011 | Orlowski | H01L 29/41791 257/347 |
| 2012/0104466 A1 | 5/2012 | Zhu et al. | |
| 2013/0092988 A1 | 4/2013 | Uozumi | |
| 2014/0001561 A1 | 1/2014 | Cheng et al. | |
| 2014/0054715 A1 | 2/2014 | Liu et al. | |

* cited by examiner

US 9,887,289 B2

METHOD AND STRUCTURE OF IMPROVING CONTACT RESISTANCE FOR PASSIVE AND LONG CHANNEL DEVICES

BACKGROUND

The present invention relates to complementary metal oxide semiconductor (CMOS) fabrication and devices, and more specifically, to methods and structures for reducing contact resistance.

CMOS is used for constructing integrated circuits. CMOS technology is used in microprocessors, microcontrollers, static RAM, and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

SUMMARY

According to an embodiment, a semiconductor device includes a gate arranged on a substrate; a source/drain formed on the substrate adjacent to the gate; a source/drain contact extending from the source/drain and through an interlayer dielectric (ILD) over the source/drain, a portion of the source/drain positioned adjacent to the source/drain contact; and a silicide positioned along a sidewall of the source/drain contact between the portion of the source/drain and the source/drain contact, and along an endwall of the source/drain contact between the source/drain contact and the substrate.

According to another embodiment, a semiconductor device includes a gate arranged on a substrate; an epitaxially grown semiconductor material formed on the substrate adjacent to the gate; a trench extending from the substrate through an interlayer dielectric (ILD) disposed over the substrate and between the trench and the gate, a conductive material disposed within the trench to form a source/drain contact, and the epitaxially grown semiconductor material positioned adjacent to the source/drain contact; and a silicide film lining a sidewall of the trench between the epitaxially grown semiconductor material and the conductive material.

Yet, according to another embodiment method of making a semiconductor device includes forming a gate on a substrate; forming a source/drain on the substrate and adjacent to the gate; depositing a low-k dielectric on the source/drain and around the gate; removing the gate and a portion of the source/drain to form a trench that extends from a region within the substrate and through the low-k dielectric, the source/drain contacting a sidewall of the trench; forming a silicide liner along the sidewall of the trench that is in contact with the source/drain; and depositing a conductive material in the trench to form a source/drain contact.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 3A-9B illustrate exemplary methods of making semiconductor devices according to various embodiments, in which:

FIG. 3A is a cross-sectional side view after disposing a mask over gates and patterning the mask where high performance and/or passive devices are needed;

FIGS. 9A and 9B are cross-sectional side views after disposing a low-k material and forming the second portions of the source/drain contacts.

DETAILED DESCRIPTION

For semiconductor devices that are 7 nanometers (nm) and beyond, the gate pitch is, for example, less than 50 nm. Challenges of devices with these dimensions include contact to gate electrical shorting due to the tight gate pitch and reduced contact area, which may lead to high contact resistivity. High performance logic devices also have limited source/drain contact areas and epitaxial areas. Passive device performance also suffers from the same contact patterning scheme as logic devices and static random access memory (SRAM) devices.

Figure 1:
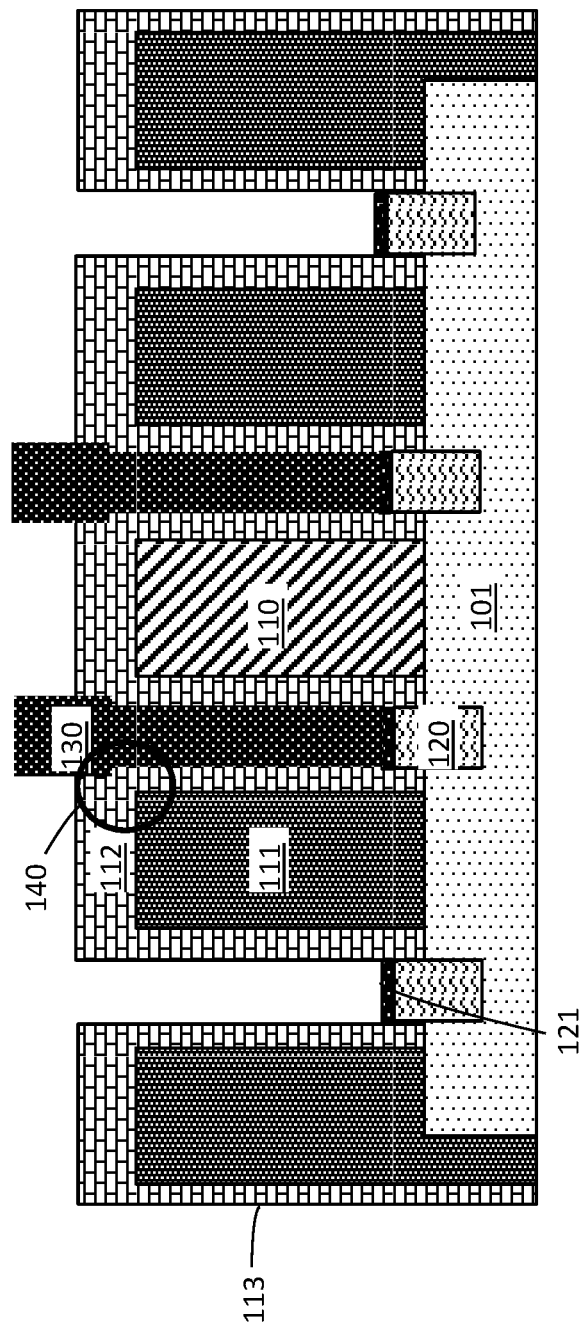
FIG. 1 illustrates a comparative example of a semiconductor device with reduced contact areas that may lead to electrical shorting between the source/drain contact and the gate.

For example, FIG. 1 illustrates a comparative example of a semiconductor device that may lead to electrical shorting between the source/drain contact 130 and the dummy gate 111, for example, in area 140 due to the small dimensions. Gates are formed on a substrate 101. The gates may include one or more dummy gates (sacrificial gates) 111 and one or more active gates 110. A gate spacer 113 is positioned along a sidewall and a gate cap 112 is positioned on a surface of the gate. Source/drains 120 that include epitaxial growth are formed on the substrate 101 between the gates. A silicide 121 is formed on a surface of the source/drains 120 between the source/drain 120 and the source/drain contacts 130. The reduced contact area of the silicide 121 may also lead to high contact resistivity.

Figure 10:
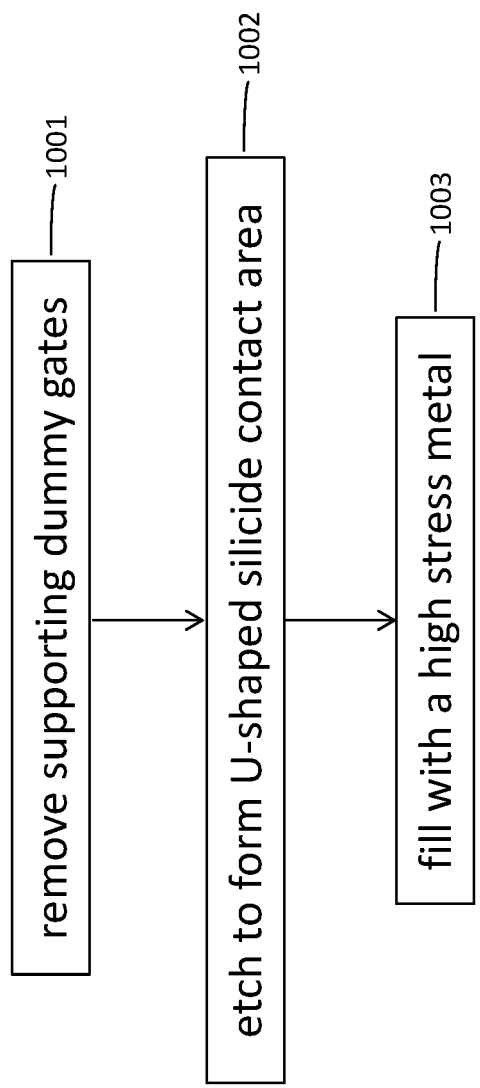
FIG. 10 is a flow diagram of process flow for making a semiconductor device according to embodiments.

Accordingly, various embodiments provide an integration process flow that utilizes the dummy gate area to maximize the silicide contact area and reduce contact resistance for high performance logic and passive devices, which is described in FIG. 10 below. Supporting dummy gates are included in the devices. Dummy gates are removed where high performance is needed. After removing the dummy gates, deep etching is performed to make a U-shaped silicide contact area. Because the passive device pitch is large, a large source/drain area may be used. The described process flow and devices avoid contact to gate electrical shorting (effective capacitance reduction ($C_{eff}$)). The U-shaped silicide increases the contact area, resulting in effective resistance ($R_{eff}$) reduction. The contacts on the U-shaped silicide area may also be filled with a high stress metal to provide additional strain to the channel. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 2:
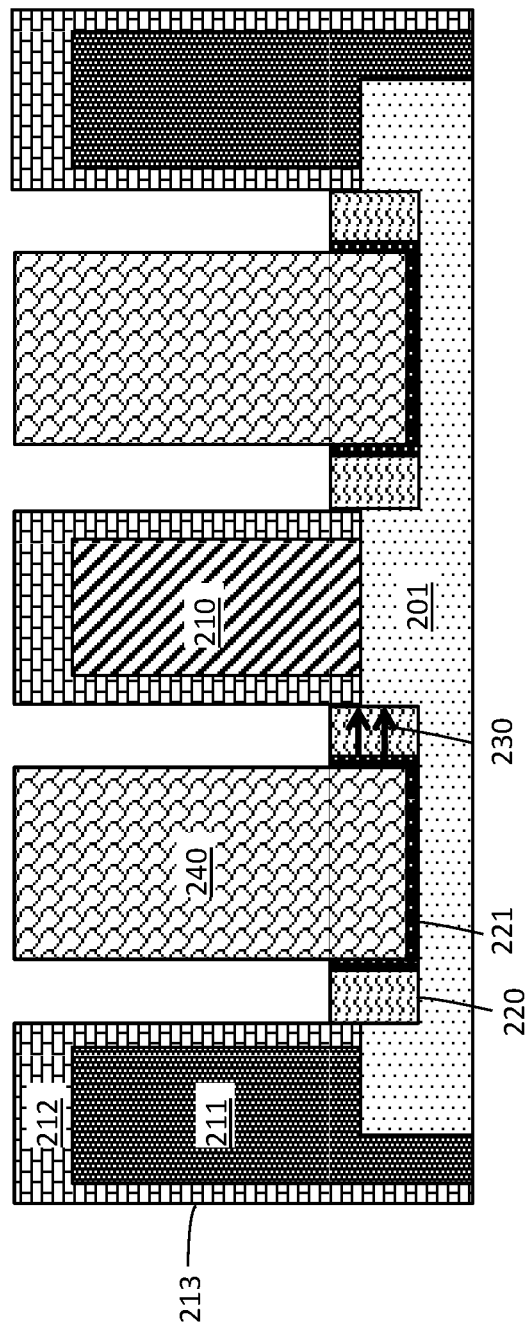
FIG. 2 is a cross-sectional side view of a semiconductor device according to various embodiments with a U-shaped silicide having increased contact area and low resistivity.

Turning again to the Figures, FIG. 2 is a cross-sectional side view of a semiconductor device according to various embodiments with a U-shaped silicide 221 that provides increased contact area and low resistivity. Gates are formed on a substrate 301. The gates may include one or more dummy gates (sacrificial gates) 211 and one or more active gates 210. The gates include a gate spacer 213 positioned along a sidewall and a gate cap 212 positioned on a surface. Source/drains 220 that may include epitaxial growth are formed on the substrate 301 between the gates. Dummy gates are removed and replaced with a source/drain contact 240 that includes a high stress material. The distance between the gate and the source/drain contact 240 avoids electrical shorting. The high stress material also enhances strain 230 to the channel region. A U-shaped silicide 221 is formed on surfaces of the source/drain 220 and substrate 301. The U-shaped silicide 221 and source/drain contact 240 provide increased surface contact area, and thus, low resistivity.

FIGS. 3A-9B illustrate exemplary methods of making semiconductor device according to various embodiments. The process flow may be applied to other transistor devices, including, but not limited to, FinFETs, planar FETs, and extremely thin silicon-on-insulator (ETSOI) FETs. Further, although the process flow is illustrated using a gate-last scheme, in which dummy gates are initially formed and subsequently removed and replaced with active gates, the described embodiments may also applied to a gate-first scheme, in which active gates are directly formed without employing an initial dummy gate.

Figure 3A:
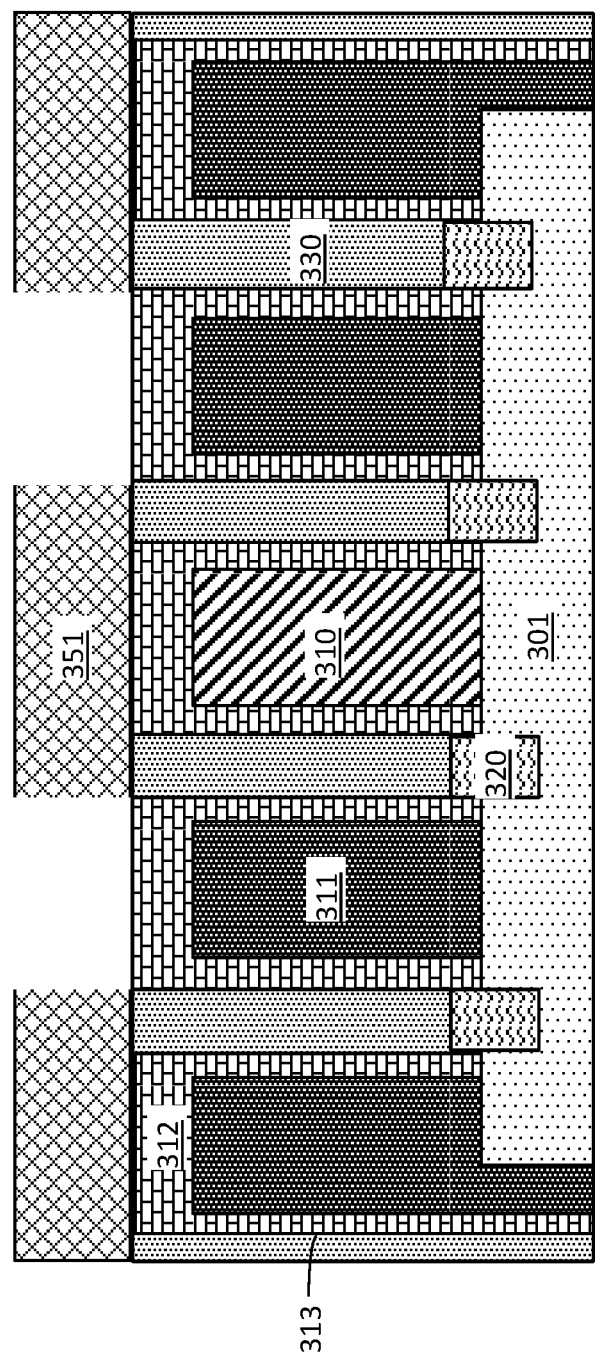
Figure 3B:
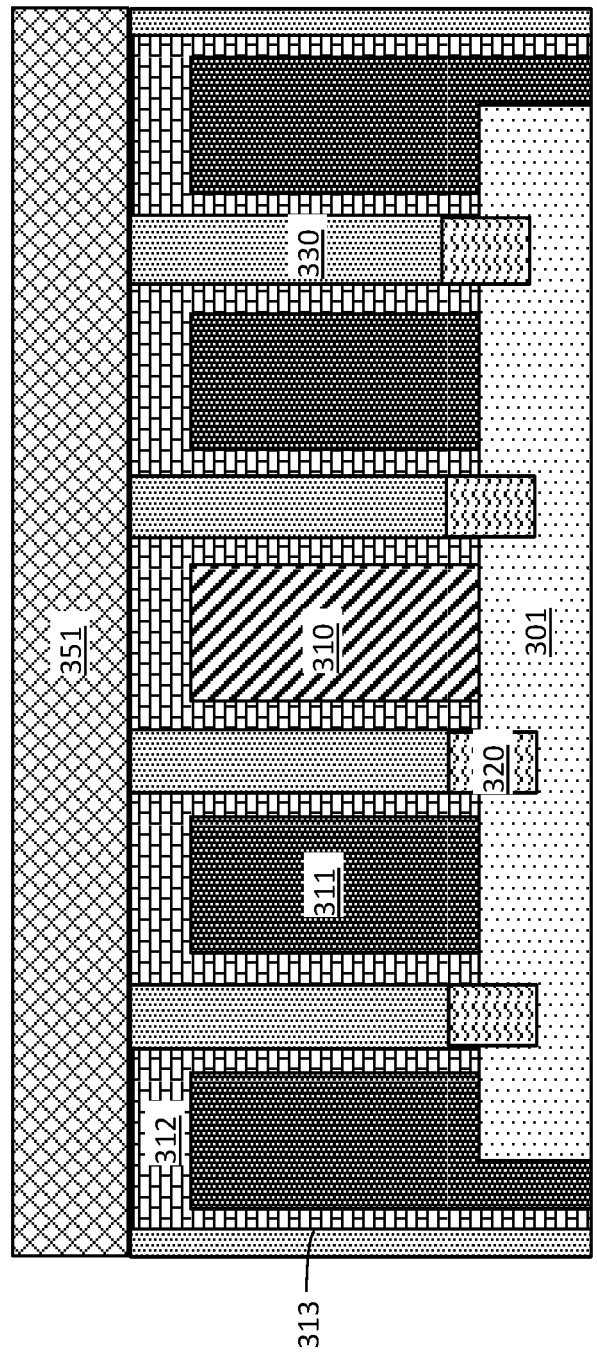
FIG. 3B is a cross-sectional side view of a tight pitch logic and SRAM device where gates are not removed (shown for comparative purposes)

FIGS. 3A and 3B are cross-sectional side views after disposing a mask 310 on gates formed on a substrate 301 and patterning the mask 310 where high performance and/or passive devices are needed. FIGS. 3A and 3B are shown for comparison purposes. FIG. 3A (and FIGS. 4A, 5A, 6A, 7A, 8A, and 9A) illustrates the process flow where high performance logic and/or passive (or long channel) devices are needed. FIG. 3B (and FIGS. 4B, 5B, 6B, 7B, 8B, and 9B) illustrates the process flow where tight pitch logic and SRAM are needed. Although not shown, the process flow shown in FIGS. 3A, 4A, 5A, 6A, 7A, 8A, and 9A is also applicable to a long channel device with a loose or relaxed pitch.

The substrate 301 may include one or more semiconductor materials. Non-limiting examples of semiconductor materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. Other examples of suitable substrates 201 include silicon-on-insulator (SOI) substrates and silicon-germanium on insulator substrates with buried oxide (BOX) layers.

The gates may include one or more dummy gates 311 and one or more active gates 310. The dummy gates 311 include a sacrificial gate material, for example, amorphous silicon (aSi) or polycrystalline silicon (poly Si). The sacrificial gate material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

To form an active gate 310, the sacrificial gate material is removed and replaced with a conductive gate stack. The conductive gate stack may include high-k metal gates formed, for example, by filling the dummy gate opening with one or more dielectric materials, one or more workfunction metals, and one or more metal gate conductor materials. The gate dielectric material(s) can be a dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used.

The work function metal(s) may be disposed over the gate dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

To complete the active gate 310, a conductive metal is deposited over the dielectric material(s) and workfunction layer(s) to form the active gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal.

The gates include gate spacers 313 positioned along sidewalls of the gates. The spacers 313 include an insulating material, for example, silicon dioxide, silicon nitride, SiOCN, or SiBCN. Other non-limiting examples of materials for the spacers 313 include dielectric oxides (e.g., silicon oxide), dielectric nitrides (e.g., silicon nitride), dielectric oxynitrides, or any combination thereof. The gate spacer 313 material is deposited by a deposition process, for example, chemical vapor deposition (CVD) or physical vapor deposition (PVD). An anisotropic dry etch process, for example, reactive ion etch (ME), is performed after depositing the insulating material to form gate spacers 313 along gate sidewalls.

The gates include gate caps 312 positioned on a surface of the gates. The gate caps 312 include an insulating hard mask material, for example, silicon nitride (SiN), SiOCN, or SiBCN. The material forming the gate caps 312 may be deposited using a deposition process, including, but not limited to, PVD, CVD, PECVD, or any combination thereof.

An interlayer dielectric (ILD) 330 surrounds the gates. The ILD 330 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The material forming the ILD 330 may be deposited by a deposition process, including, but not limited to CVD, PVD, plasma enhanced CVD, atomic layer deposition (ALD), evaporation, chemical solution deposition, or like processes.

The source/drains 320 are formed on the substrate 301 adjacent to the gates by employing an epitaxial growth process to deposit epitaxial layers onto the substrate 301. Epitaxial growth may be grown using, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The epitaxial silicon, silicon germanium, and/or carbon doped silicon (Si:C) silicon can be doped during deposition by adding a dopant or impurity.

When the transistor is a FinFET device, the epitaxial growth is formed on fins formed from the substrate 301. Yet, in other embodiments, the source/drains 320 may be formed by incorporating dopants into the substrate 301.

The mask 351 may be a lithographic mask material. The mask may be, for example, a photoresist, a planarization layer (e.g., an organic planarization layer (OPL), hard mask material (e.g., silicon nitride), spin-on polymeric material, or any combination. When the mask 351 is, for example, a photoresist, the mask 351 is patterned by exposing to a desired pattern of radiation. Then the exposed photoresist is developed and with a resist developer to provide a patterned photoresist.

The mask 351 is patterned to form one or more openings over one or more gates (dummy gates 311) to be removed, as shown in FIG. 3A, where high performance logic and/or passive devices are to be formed. In FIG. 3B, when tight pitch logic and SRAM devices are formed, the dummy gates 311 are not removed.

Figure 4A:
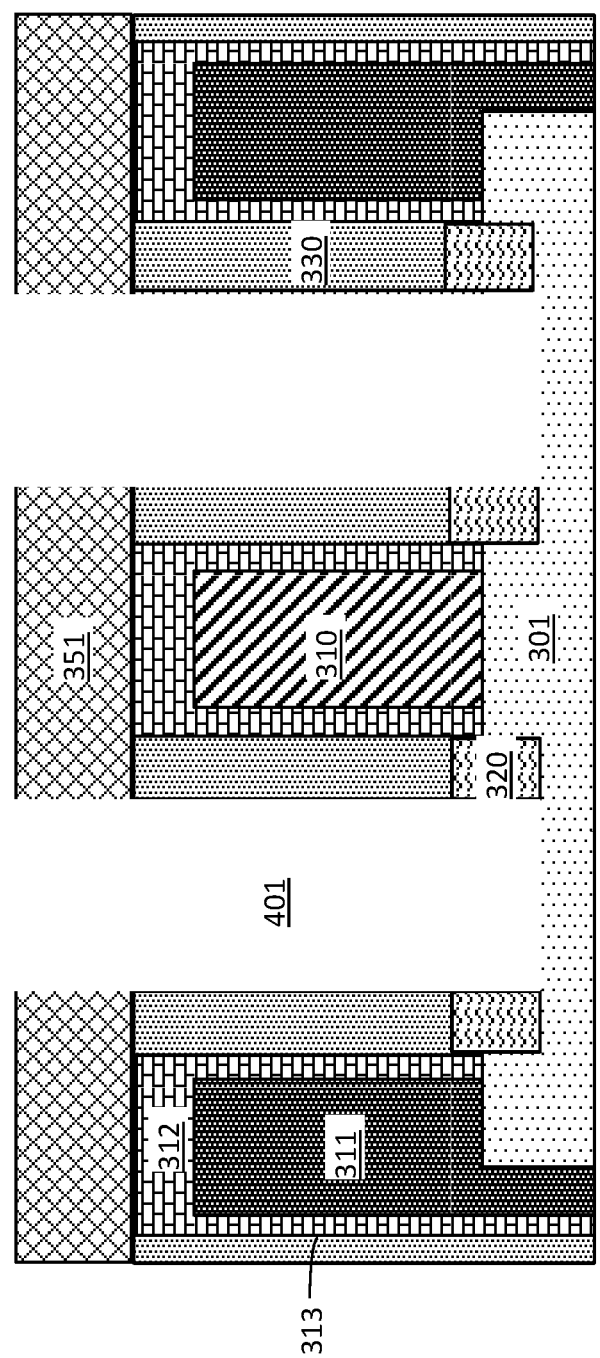
FIGS. 4A and 4B are cross-sectional side views after removing the dummy gates in the passive devices, and leaving the dummy gates intact in the tight pitch logic device.
Figure 4B:
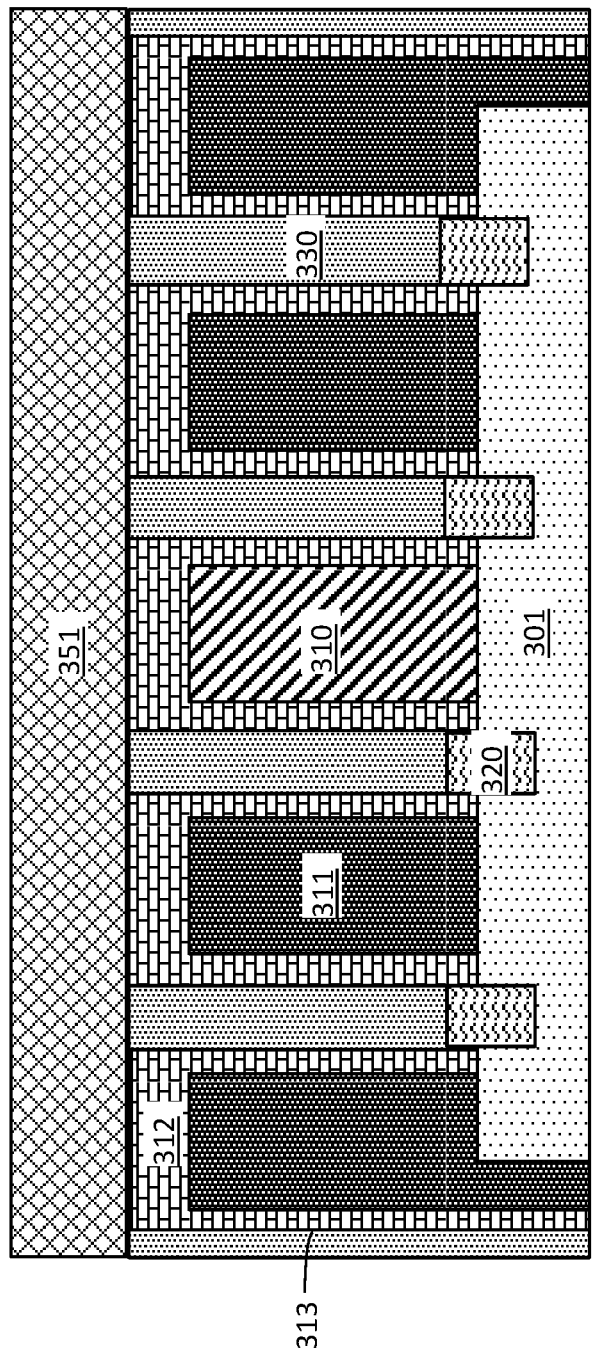

FIG. 4A is a cross-sectional side view after removing the dummy gates 311 where the high performance logic and/or passive devices are formed. For comparison, FIG. 4B is a cross-sectional side view of a tight pitch logic or SRAM where the dummy gates 311 are not removed.

The dummy gates 311, gate caps 312, spacers 313, and at least a portion of the source/drain 320 are removed, which may be performed by employing one or more wet and/or dry etch processes. For example, a planarization process such as chemical mechanical planarization (CMP) may be performed to remove a portion of the ILD 330 and gate caps 312 to expose the sacrificial gate material of the dummy gates 311. The sacrificial gate material may be removed by performing a dry etch process, for example, a reactive ion etch (ME), followed by a wet etch process. The gate spacers 313 may then be removed by, for example, $CHF_3/Ar/O_2$ and $CH_3F/O_2$ based chemistries. At least a portion of the epitaxial growth of the source/drain 320 is removed by, for example, plasma etching (RIE) using $CF_4/O_2$, $SiF_6/O_2$, $Cl_2/O_2$, and $HBr/Ar/O_2$ based chemistries, or hot ammonia ($NH_4OH$).

After removing the dummy gates 311, contact trenches 401 are formed over the substrate 301. The substrate 301 is exposed beneath the trenches 401. The trenches 401 extend from the substrate 301 and through the epitaxial growth of the source/drain 320 and the ILD 330. The ILD 330 contacts a sidewall of the trench 401, and the substrate 301 contacts and endwall of the trench 401. The trench 401 extends with a region within the substrate 301.

In some embodiments, the contact trenches 401 have a width in a range from about 10 to about 200 nm, and a depth in a range from about 100 to about 300 nm. In other embodiments, the contact trenches 401 have a width in a range from about 10 to about 50 nm, and a depth in a range from about 100 to about 200 nm. Yet, in other embodiments, the contact trenches 401 have a width in a range from about 7 to about 35 nm.

Figure 5A:
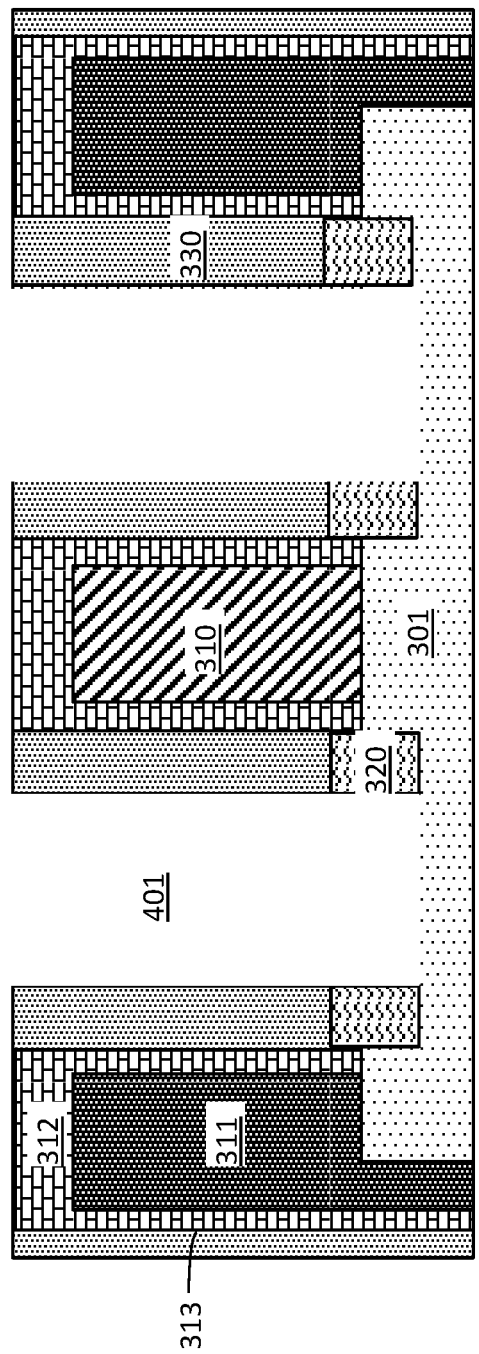
FIGS. 5A and 5B are cross-sectional side views after after removing the dummy gates and fin channel to form a U-shape in source/drain area in the passive device, and leaving the dummy gates intact in tight gate pitch logic device.
Figure 5B:
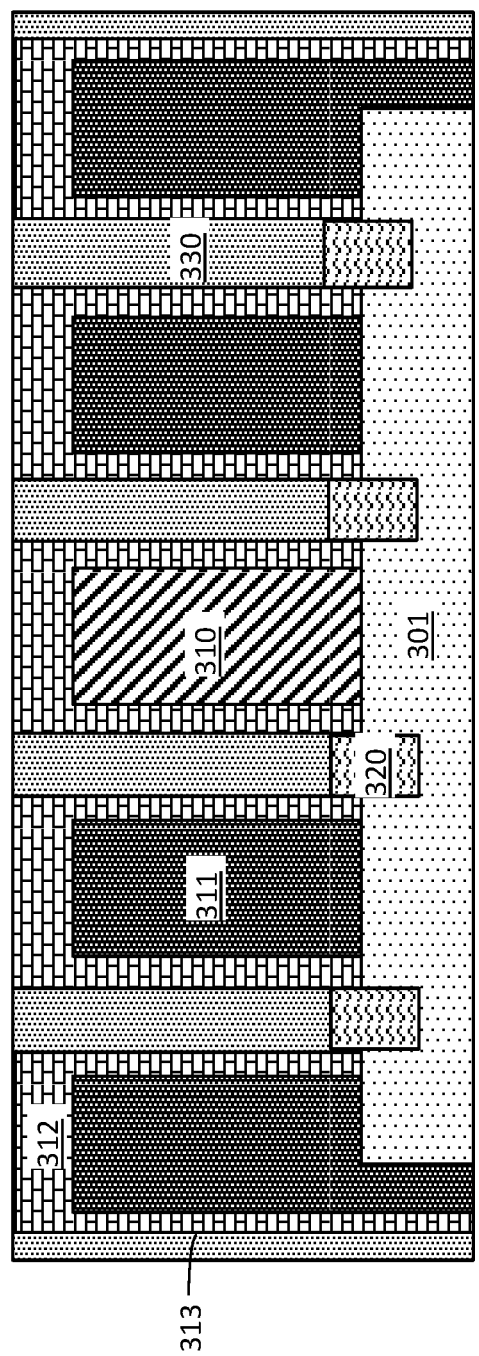

FIGS. 5A and 5B are cross-sectional side views after removing the mask 351. Methods for removing the mask 351 depend on the type of material forming the mask 351. When the mask 351 is, for example, an OPL, removal processes may include, for example, a plasma ashing process followed by a wet stripping process.

Figure 6A:
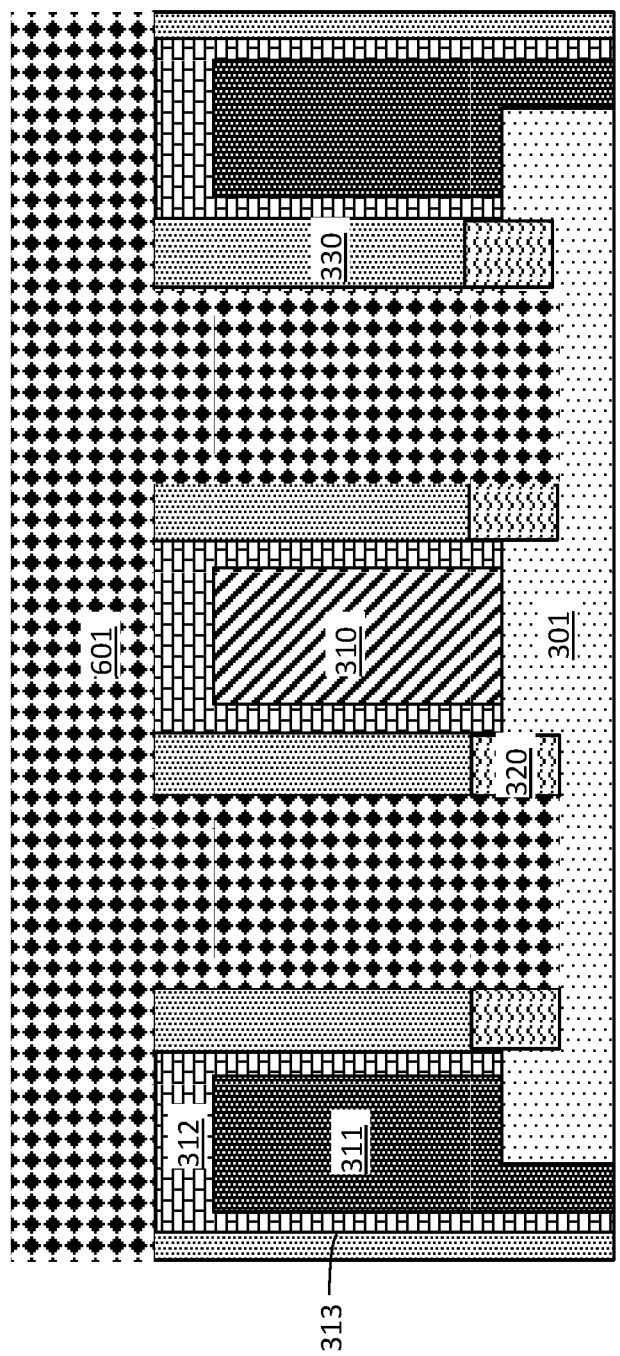
FIGS. 6A and 6B are cross-sectional side views after performing source/drain contact lithographic patterning to form source/drain contacts in the tight pitch logic and SRAM devices.
Figure 6B:
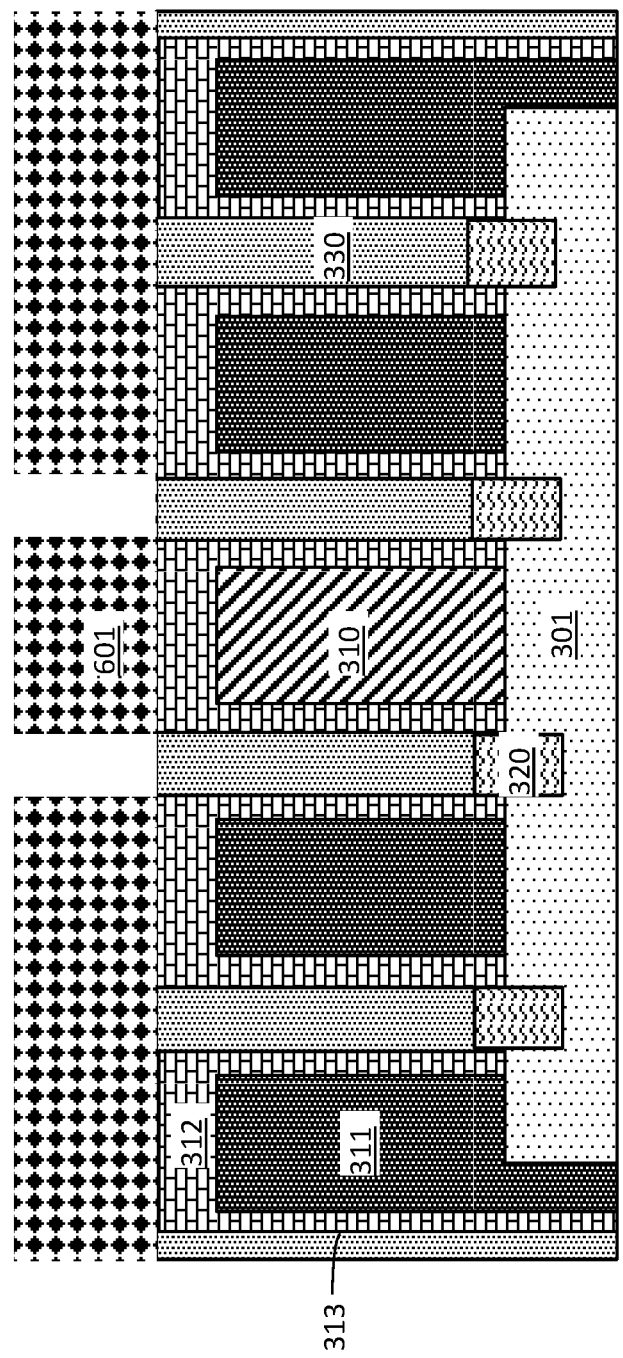

FIGS. 6A and 6B are cross-sectional side views after performing lithography to form additional source/drain contacts in the tight pitch logic and SRAM devices (FIG. 6B). A lithographic mask 601 is disposed on the gates. The mask 601 is patterned to form openings over the source/drains 320 (FIG. 6B). Because the contact trenches 401 are already formed in the high performance logic and/or passive devices (see FIG. 4A), the mask 601 material fills and the contact trenches 401. The contact trenches 401 are protected during subsequent lithography.

The mask 601 may include any materials described above for mask 351 in FIGS. 3A and 3B. Likewise, the mask 601 may be patterned as described above.

Figure 7A:
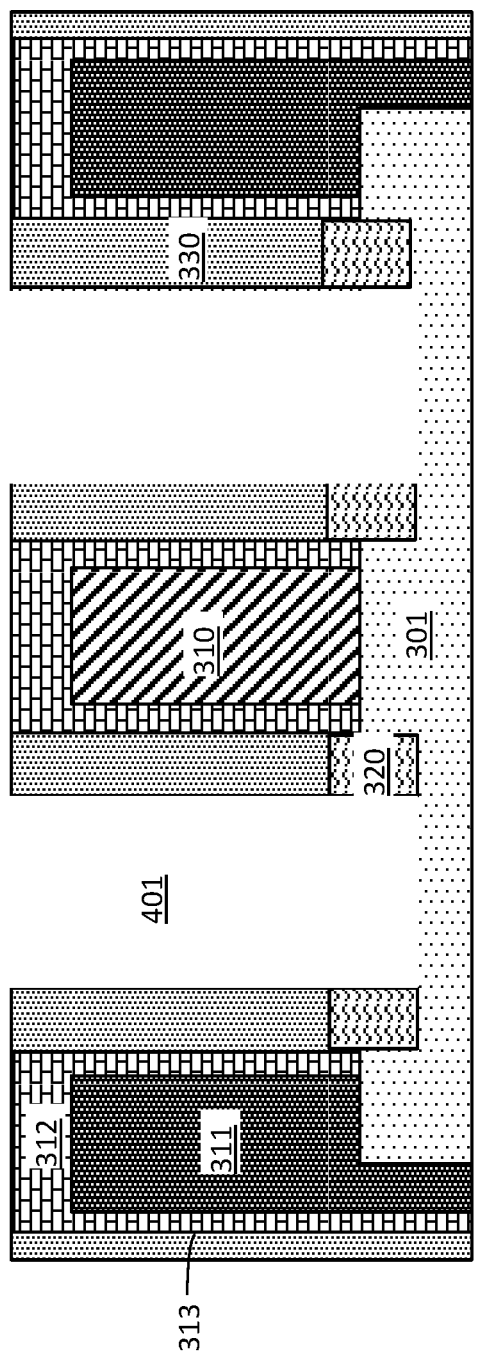
FIGS. 7A and 7B are cross-sectional side views after recessing the inter-layer dielectric (ILD) down to the level of the source/drain in the tight pitch logic and SRAM devices and removing the lithography mask.
Figure 7B:
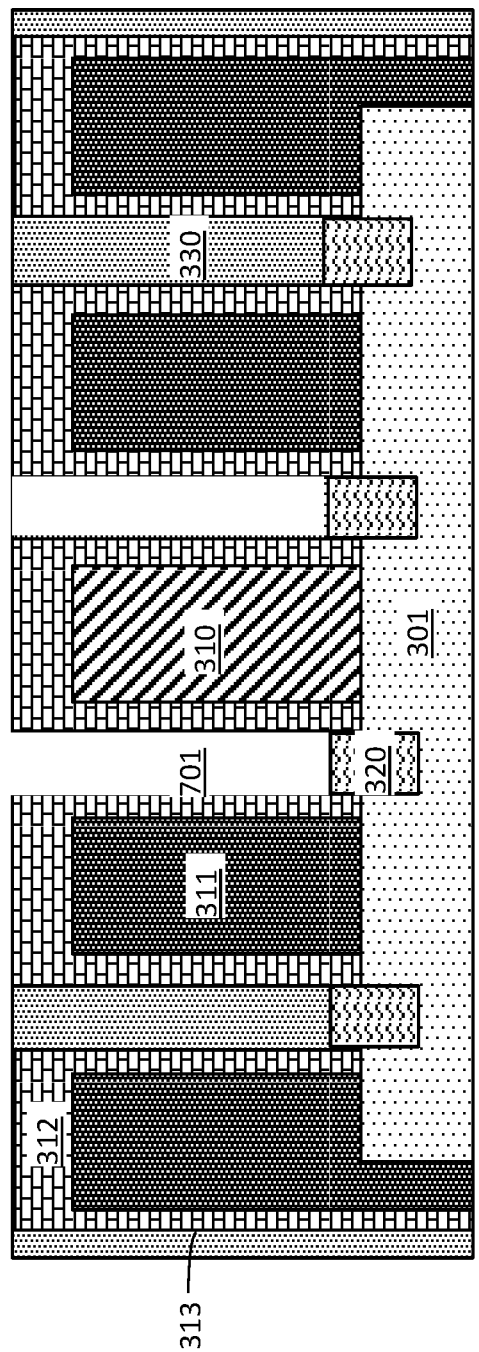

FIGS. 7A and 7B are cross-sectional side views after recessing the inter-layer dielectric (ILD) down to the level of the source/drain 320 in the tight pitch logic devices and SRAM devices (FIG. 7B) and removing the lithography mask 601.

The ILD 330 may be recessed by removing/etching the ILD 330. The ILD 330 may be removed by, for example, a dry etch process (e.g., RIE). The resulting contact trenches 701 over the source/drain 320 in the tight pitch logic devices (FIG. 7B) have dimensions that are smaller than the trenches 401 in the high performance logic and/or passive devices (FIG. 7A).

Figure 8A:
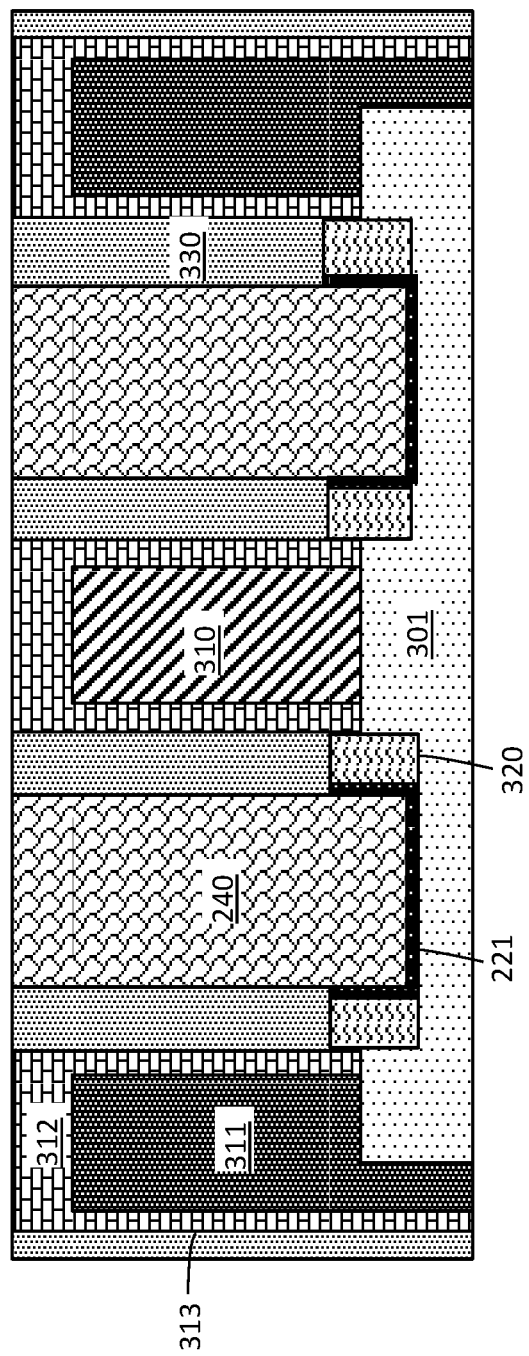
FIGS. 8A and 8B are cross-sectional side views after performing salicidation, metallization, and planarization.
Figure 8B:
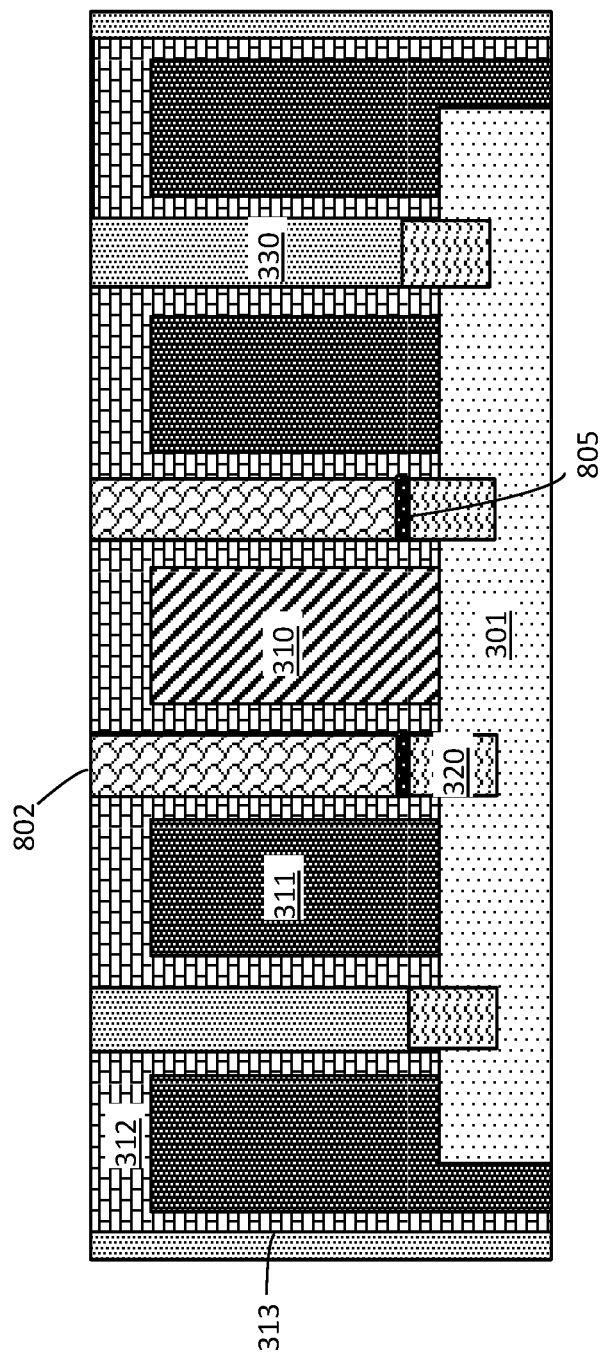

FIGS. 8A and 8B are cross-sectional side views after performing salicidation, metallization, and planarization to form the source/drain contacts. In FIG. 8A of the high performance logic and/or passive device, the U-shaped silicide 221 (silicide film) is formed. The U-shaped silicide 221 contacts the sidewalls of the source/drain contact 240 and the endwall of the source/drain contact 240. The U-shaped silicide 221 is positioned between the source/drain contact 240 and the source/drain 320, as well as between the substrate 301 and the source/drain contact 240. The epitaxial growth of the source/drain 320 is adjacent to the source/drain contact 240 and contacts the source/drain contact 240 along a sidewall. The ILD 330 also contacts sidewalls of the source/drain contact 240 over the source/drain 320. The ILD 330 is positioned between the source/drain contact 240 and the active gate 310.

In FIG. 8B of the tight pitch logic and SRAM device, the silicide 805 is positioned on a surface of the source/drain 320, covering a smaller area than the U-shaped silicide 221 in FIG. 8A. The source/drain contact 802 contacts the silicide 805 and the gate spacers 313.

The source/drain contact 802 has smaller dimensions than the source/drain contact 240. The dimensions of the source/drain contact 802 (width and depth) is defined by the dimensions of the trench 701 (described above in FIG. 7B). The dimensions of the source/drain contact 240 is defined by dimensions of the trench 401 (described above in FIG. 4A).

The silicidation process includes forming a metal silicide film by performing a thermal treatment to a metallic film. The metallic film is deposited within the trenches 401 and 701 by performing an evaporation process or a sputtering process. The metallic film is annealed by heating inside a furnace or performing a rapid thermal treatment in an atmosphere containing pure inert gases (e.g., nitrogen or argon) so that the metal reacts with exposed silicon or silicon germanium of the substrate 301 and/or source/drain 320 to form a metal silicide. Non-limiting examples of suitable metal silicide materials include titanium silicide, tungsten silicide, cobalt silicide, nickel silicide, molybdenum silicide, platinum silicide, or any combination thereof.

After forming the silicides, a conductive material is then deposited in contact trenches 401 and 701. The conductive material may be a high stress metal, for example, hydrogen incorporated SiN; a carbon mixture material, e.g., $Al_2O_3$, $ZrO_2$ or other like oxides; a composition of a conductive metal, e.g., tungsten (W), platinum (Pt), cobalt (Co) or titanium (Ti); polysilicon; a stack including a layer of polysilicon and a conductive metal; a metallic silicide such as $WSi_x$; a stack including polysilicon and a metallic silicide; or other like conductive materials, and composition of $SiO_2$ or SiN. The conductive material may also be, but is not limited to, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 330, gate cap 312, and the gate spacers 313.

Figure 9A:
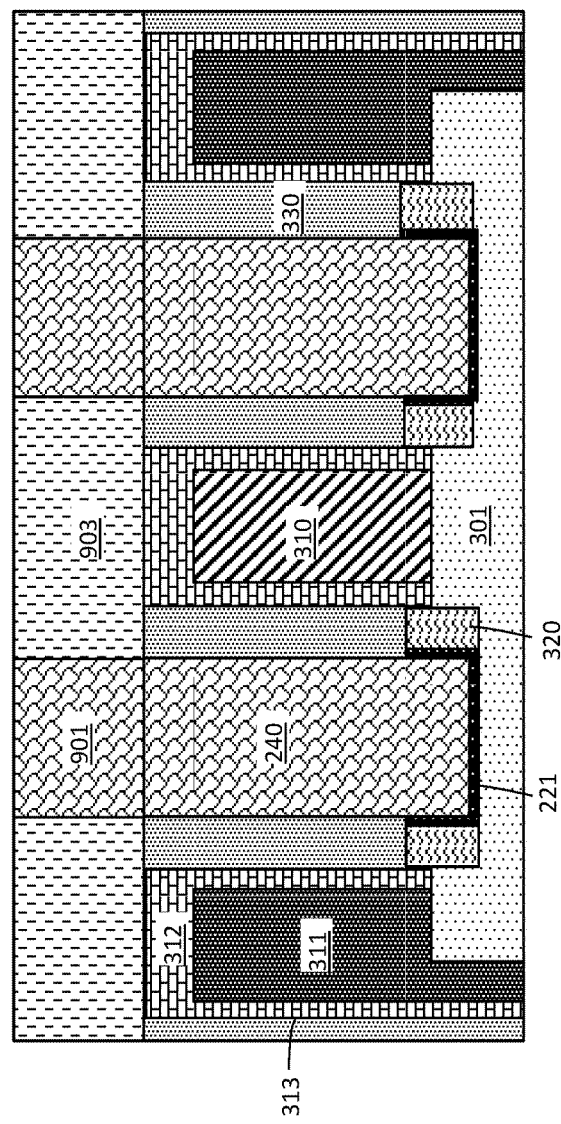
Figure 9B:
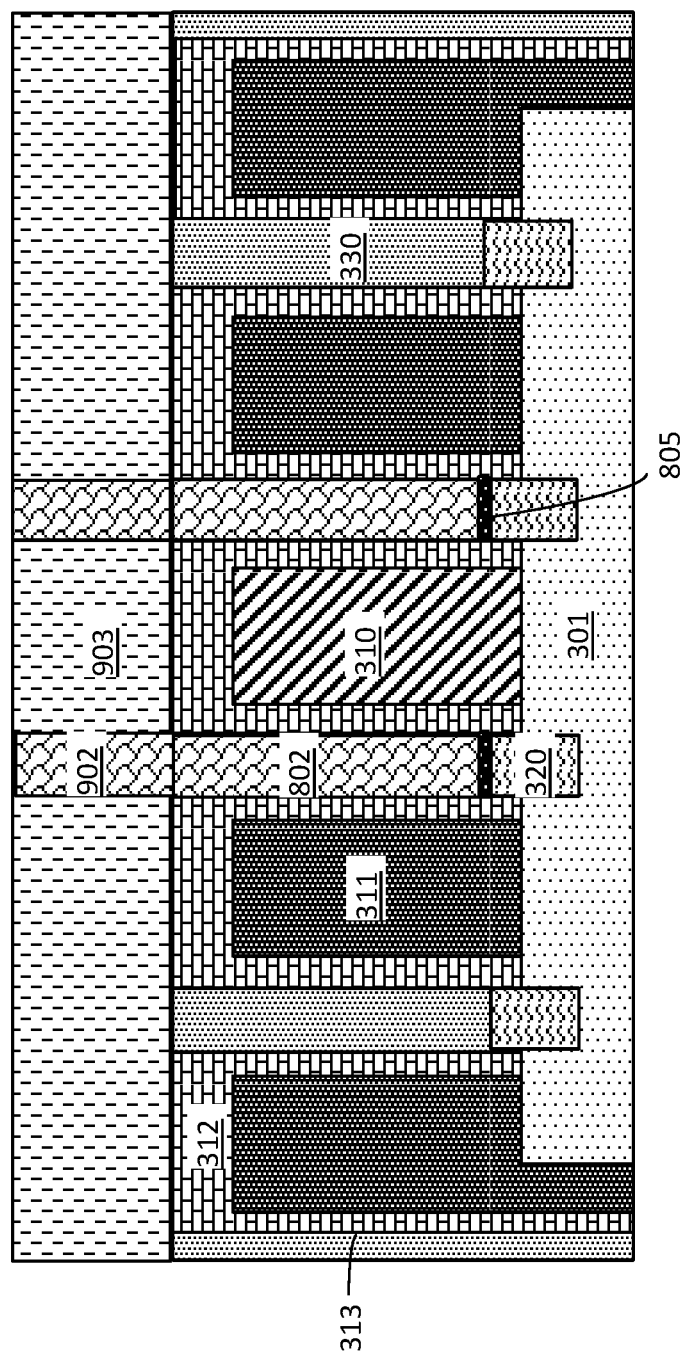

FIGS. 9A and 9B are cross-sectional side views after disposing a low-k material 903 on the gates and source/drain contacts 240 and 802 and forming the second portions of the source/drain contacts in the low-k material 903. The low-k dielectric material 903 may be a material with a k of less than 4.0, for example, silicon oxide, spin-on-glass, a flowable oxide, a high density plasma oxide, borophosphosilicate glass (BPSG), or any combination thereof. The material forming the low-k dielectric material 903 may be deposited by a deposition process, including, but not limited to CVD, PVD, plasma enhanced CVD, atomic layer deposition (ALD), evaporation, chemical solution deposition, or like processes.

The second portions 901 and 902 of the source/drain contacts 240 and 802 may be formed by patterning and etching the low-k dielectric 903 over the source/drain contacts 240 and 802 to form trenches, followed by depositing a conductive material in the trenches as described above in FIGS. 8A and 8B.

As described above, various embodiments provide an integration process flow that utilizes the dummy gate area to maximize the silicide contact area and reduce contact resistance for high performance logic and passive devices. FIG. 10 is a flow diagram of process flow for making a semiconductor device according to embodiments. At box 1001, supporting dummy gates are removed where high performance is needed. After removing the dummy gates, deep etching is performed to make a U-shaped silicide contact area at box 1002. Because the passive device pitch is large, a large source/drain area may be used. The U-shaped silicide increases the contact area, resulting in effective resistance ($R_{eff}$) reduction. Optionally, at box 1003 the contacts on the U-shaped silicide area may also be filled with a high stress metal to provide additional strain to the channel.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
    an active gate comprising a conductive gate stack arranged on a substrate;
    a dummy gate comprising a sacrificial gate material arranged on the substrate;
    a source/drain contact arranged between the active gate and the dummy gate, the source/drain contact extending from a source/drain and through an interlayer dielectric (ILD) over the source/drain, a portion of the source/drain positioned between the dummy gate and the source/drain contact and another portion of the source/drain positioned between the active gate and the source/drain contact; and
    a silicide liner positioned along a bottom sidewall of the source/drain contact and along a bottom endwall of the source/drain contact between the source/drain contact and the substrate, the silicide liner directly contacting the substrate.

2. The semiconductor device of claim 1, wherein the source/drain comprises an epitaxially grown semiconductor material.

3. The semiconductor device of claim 1, wherein the ILD contacts a sidewall of the source/drain contact.

4. The semiconductor device of claim 1, wherein the silicide is a U-shaped film.

5. The semiconductor device of claim 1, wherein the ILD is disposed between the source/drain contact and the active gate and between the source/drain contact and the dummy gate.

6. The semiconductor device of claim 1, wherein a width of the source/drain contact is in a range from about 7 to about 35 nm.

7. A semiconductor device, comprising:
    an active gate comprising a conductive gate stack arranged on a substrate;
    a dummy gate comprising a sacrificial gate material arranged on the substrate;
    an epitaxially grown semiconductor material formed on the substrate between the active gate and the dummy gate;
    a source/drain contact comprising a conductive material disposed between the active gate and the dummy gate, the source/drain contact directly contacting sidewalls of each of the dummy gate and the active gate; and
    a silicide film lining a bottom endwall of the source/drain contact between the epitaxially grown semiconductor material and the conductive material of the source/drain contact.

8. The semiconductor device of claim 7, wherein the ILD contacts a sidewall of the source/drain contact.

9. The semiconductor device of claim 7, wherein a width of the source/drain contact is in a range from about 7 to about 35 nm.

* * * * *